(12) United States Patent
Murray

(10) Patent No.: US 10,917,364 B2
(45) Date of Patent: Feb. 9, 2021

(54) MODULAR NETWORK SWITCH COMPONENTS AND ASSEMBLY THEREOF AND METHOD OF USE

(71) Applicant: Dean Murray, St. George, UT (US)

(72) Inventor: Dean Murray, St. George, UT (US)

( * ) Notice: Subject to any disclaimer, the term of this patent is extended or adjusted under 35 U.S.C. 154(b) by 0 days.

(21) Appl. No.: 16/519,208

(22) Filed: Jul. 23, 2019

(65) Prior Publication Data

US 2020/0036656 A1 Jan. 30, 2020

Related U.S. Application Data

(60) Provisional application No. 62/702,982, filed on Jul. 25, 2018.

(51) Int. Cl.
| | | |
|---|---|---|
| *H05K 7/14* | (2006.01) | |
| *H05K 7/20* | (2006.01) | |
| *H04L 12/931* | (2013.01) | |
| *H01R 25/00* | (2006.01) | |

(52) U.S. Cl.
CPC ........... *H04L 49/40* (2013.01); *H05K 7/1487* (2013.01); *H05K 7/20709* (2013.01); *H01R 25/006* (2013.01)

(58) Field of Classification Search
CPC .. H04L 49/40; H05K 7/1487; H05K 7/20709; H01R 25/006
See application file for complete search history.

(56) References Cited

U.S. PATENT DOCUMENTS

| | | | |
|---|---|---|---|
| 2014/0098492 A1* | 4/2014 | Lam | H05K 7/20727 361/692 |
| 2016/0128230 A1* | 5/2016 | Lam | H05K 7/20727 361/695 |
| 2016/0285185 A1* | 9/2016 | Newman | H01R 12/737 |
| 2017/0265333 A1* | 9/2017 | Teeter | H05K 7/20709 |
| 2017/0331766 A1* | 11/2017 | Schmidtke | H05K 7/1489 |
| 2018/0242442 A1* | 8/2018 | Luskind | G06F 1/182 |

* cited by examiner

*Primary Examiner* — Abhishek M Rathod
(74) *Attorney, Agent, or Firm* — Gurr Brande & Spendlove, PLLC; Robert A. Gurr

(57) ABSTRACT

A switch having two or more logical switching units which allow servers or other networked equipment to be connected into two or more different networks without expanding the switch into more than 1U is disclosed. A modular switching node and associated housing that allows servers or other networked equipment to be connected into two or more different networks without expanding the switch into more than 1U, and which allows failing parts to be replaced or upgraded without requiring the replacement of the entire switch is disclosed.

6 Claims, 12 Drawing Sheets

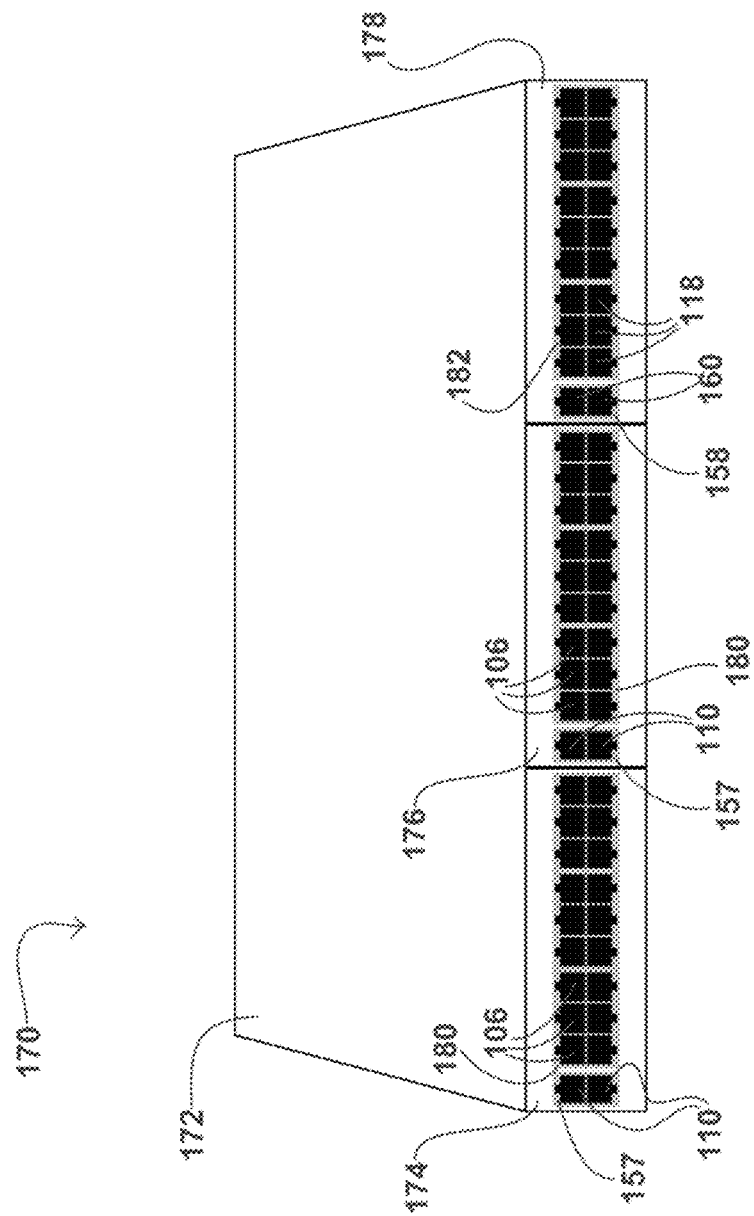

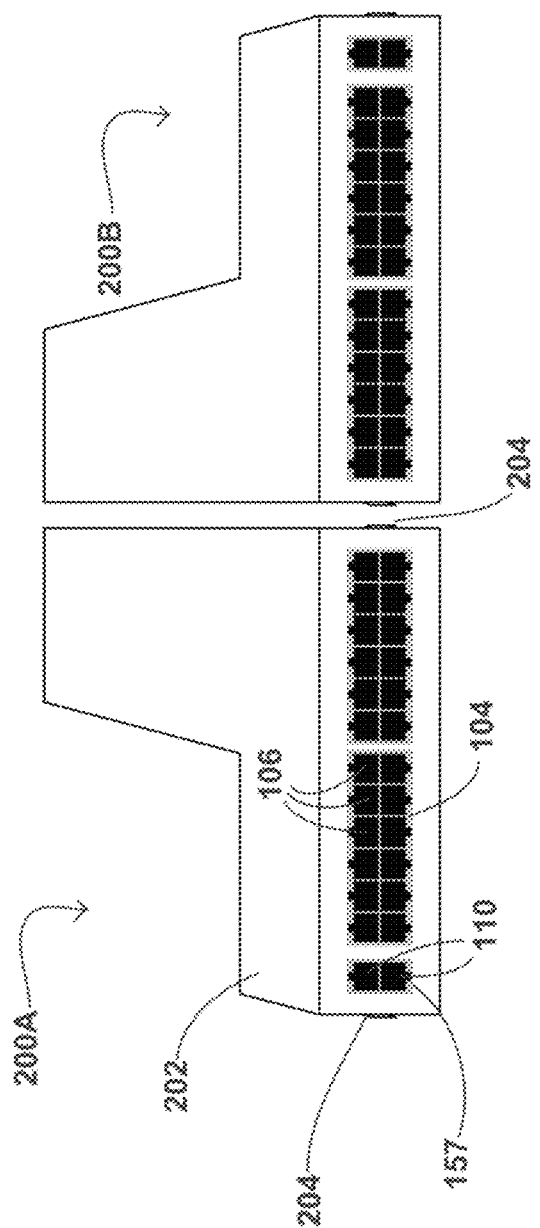

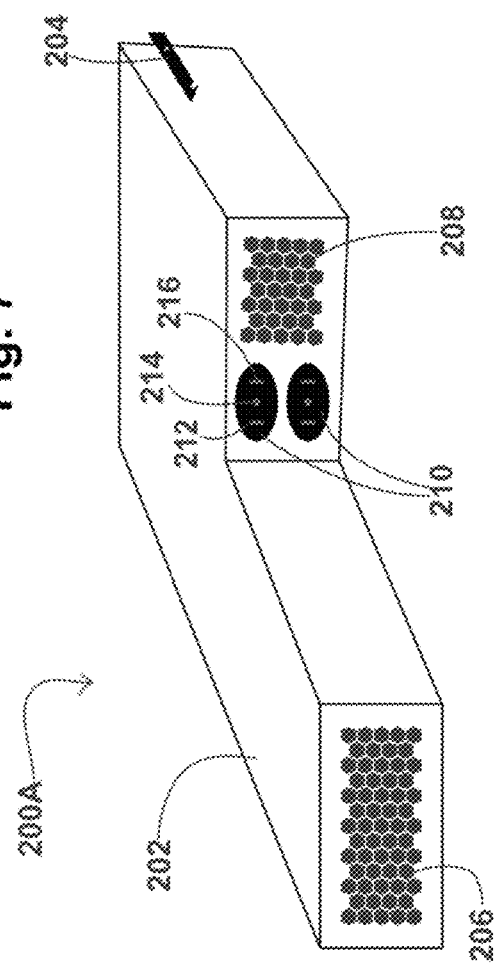

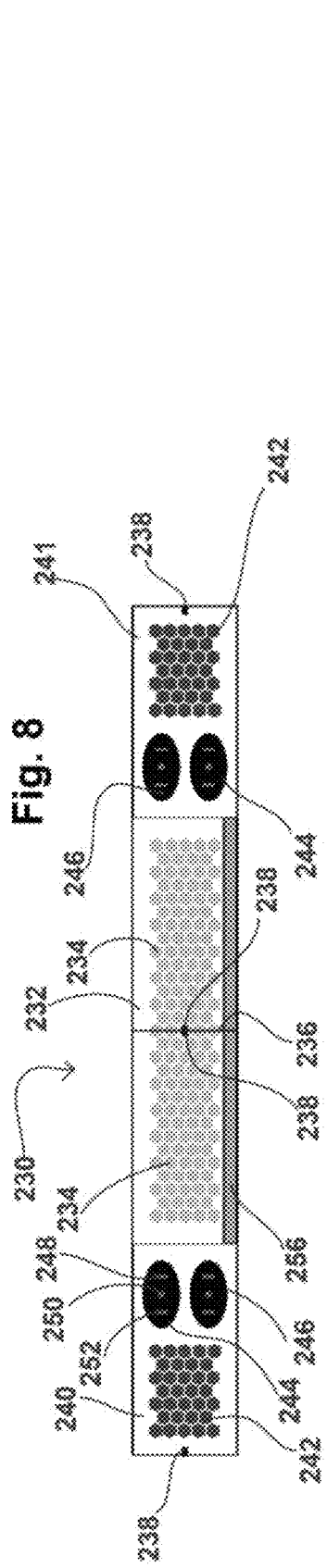

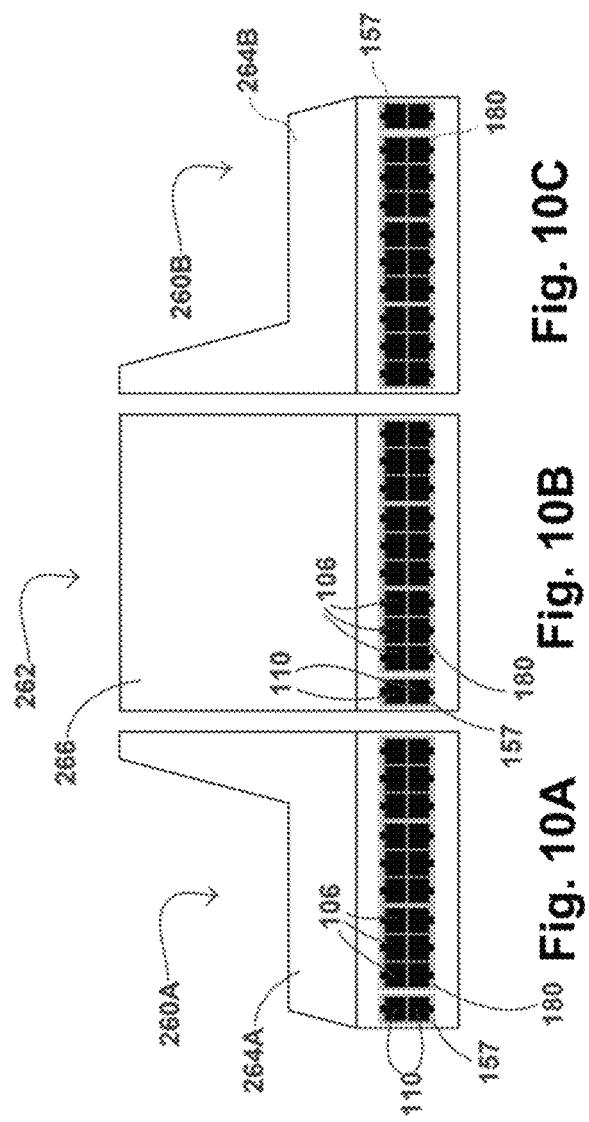

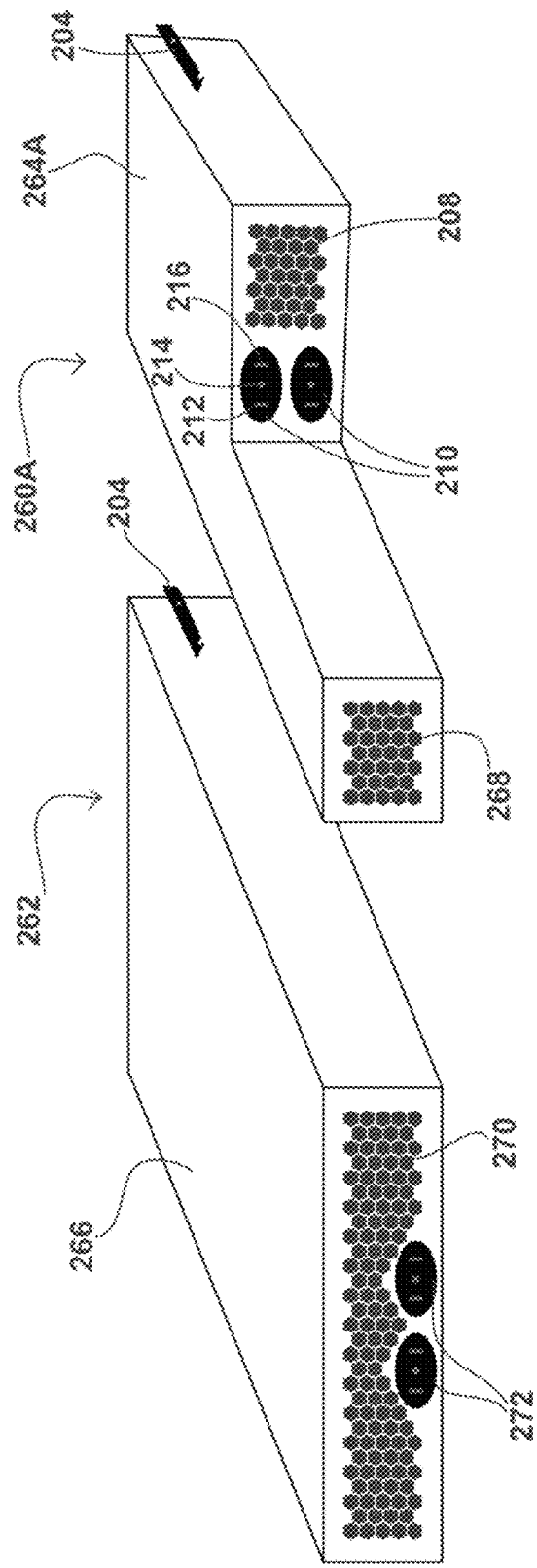

MODULAR NETWORK SWITCH COMPONENTS AND ASSEMBLY THEREOF AND METHOD OF USE

CROSS-REFERENCE TO RELATED APPLICATIONS

This application claims the benefit of U.S. Provisional Application Ser. No. 62/702,982, filed on Jul. 25, 2018, which is incorporated herein by reference.

TECHNICAL FIELD

The present disclosure relates to datacenter switches. More particularly, the present disclosure relates to a new formfactor and modular components for switches that increase capacity and efficiency of the datacenters.

BACKGROUND

The need for more datacenters, and for those datacenters to be larger, more efficient, and provide more capacity, is growing on a daily basis. Due to increased need and the high cost of building new datacenter space, it is important to make the most of the space available in current datacenters. The industry standard of racking servers in cabinets designed to stack servers vertically has done a lot to ensure that the available cubic space is efficiently utilized; however, there are still additional refinements that can be made to further increase the amount of computational power that can be put into a given datacenter. Despite the use of blade servers and micro clouds, physical space—and the investment into switching hardware—is not efficiently used due to the server-switch connections, and the physical configuration of hardware in current datacenters. In other words, it is not uncommon to have either 1) less than 100% utilization of switch ports, or 2) 100% utilization of switch ports, but less than 100% utilization of the cabinet slots.

Several constraints prevent greater efficiency. Datacenter cabinets used for storing servers, switches, and other computer equipment are constructed for receiving computer equipment that is about 40 inches deep, about 17.3 inches wide, and either 1.72 inches tall, or 1.72 inches plus some multiple of 1.75 inches tall. Each 1.75-inch unit of vertical space on a given datacenter cabinet is referred to as a single U.

In order to efficiently use the space dedicated to top-of-rack switches, it is desirable to increase the port density per U of cabinet space, which has happened over time and resulted in top-of-rack switches that contain as many as 48 or 50 ports in a single U. This increase in port density on the part of top-of-rack switches has generally increased both the count and the vertical height of the servers associated with the top-of-rack switches.

Considerable efforts have been made to increase the efficiency of space being dedicated to servers inside of datacenters. These efforts have resulted in server configurations that have one or more of: 1) an increased node count per U of space; 2) increased port density per U of space; or 3) increased network throughput per port.

These improvements have, where they are employed, generally helped offset the increased server volume that would otherwise be required to service top-of-rack switches with expanding port counts; however, it is a truism that all other aspects being held constant, a top-of-rack switch with 48 ports services twice as many servers as a 24-port top-of-rack switch, and that those servers therefore require twice as much vertical space inside the cabinet as what would be required for the servers associated with a 24-port top-of-rack switch.

Separately, due to needed improvements in redundancy, network throughput, and remote manageability of servers, there has been a movement towards having each server in a datacenter connect to two or more networks, and therefore, two or more top-of-rack switches.

For example, in web hosting applications it is common for each server to be connected to one or two metered public networks, an unmetered private network, and an IPMI or management network. The IPMI network allows the server to be monitored, rebooted, powered on, and otherwise managed remotely. The private network allows hosting clients to connect to other servers inside the datacenter and move data between the two without incurring bandwidth charges. The public network allows the server to connect to the outside world, both sending and receiving data. Connecting the server to two public networks provides redundancy in the event that one of the switches goes down and/or additional network throughput to the outside world over and above what could be achieved with a single connection.

As previously described, the trend towards more ports per top-of-rack switch has tended to increase the vertical size of the servers associated with each switch. The movement towards each server being connected to multiple networks—sometimes in a redundant configuration to one or more of those networks—and therefore to multiple top-of-rack switches (each of which generally has a 2U cable manager placed immediately above the unit in question) has tended to increase the vertical space dedicated to switching equipment for any particular group of servers. In combination, these two trends have resulted in logical computing units (LCUs) which require more and more vertical space inside of a given cabinet.

Given the exceedingly large number of different options when it comes to servers, switching, and storage equipment, there are a large number of different configurations for an LCU. In some of the configurations, the result is that not all of the space in a given cabinet is used. Unused space inside of a datacenter cabinet represents undesirable inefficiency; however, with the state of the current art, there are not any good methods of addressing these inefficiencies.

In certain instances, the datacenter tenant can opt for an LCU configuration which is less dense (less space efficient). This spreads out the same or similar computing, switching, and storage capabilities across more vertical space inside the cabinet, and will, in many circumstances, result in a reduction in the initial outlay for the equipment; however, at its most fundamental level, it isn't addressing the inefficiency as much as it is trading a reduction in initial outlays for ongoing increases in operating expenses as compared to what could be achieved if a higher density solution were able to be used in a configuration that took advantage of all of the available vertical space in the cabinet.

Another possible solution would be to proceed with the high-density LCU solution and then bring in dissimilar, generally less-capable, hardware to fill in the unused space in the cabinet. While there are some benefits to this approach, it results in additional operational complications for the datacenter tenant. Not only do they have to stock an increased variety of equipment—along with the requirement to stock an increased variety of parts and components for when something fails—it also creates additional costs when it comes to troubleshooting driver-related hardware problems that can cause equipment not to function as expected.

The final option in the current art is to bring in networking, storage, and server equipment that is homogenous to the LCUs being used in the bulk of the cabinet. That equipment is then used to create a fractional LCU that contains some percentage of the equipment that would otherwise go into a standard LCU for their production environment. This approach runs into problems where the desired ratios of servers (processing power), storage, and networking equipment varies from the ratios needed in the production environment. To the extent that this ratio varies from the ideal for the production environment, some percentage of the initial outlay for the hardware in the fractional LCU ends up being wasted. This is driven by the fact that individual components inside of the LCU cannot be broken into smaller units. An example of this is the top-of-rack switches. If a 48-port switch is ideal for the production environment of a datacenter tenant, then rolling out a fractional LCU that only contains enough servers to utilize 18 of the ports wastes more than 50% of the switch's capacity. In this instance, the utilization of the otherwise wasted space in the cabinet requires a significantly higher capital outlay per unit of processing capacity than a normal LCU for the production environment in question. Additional costs are also borne by the datacenter in that the datacenter technicians have to deal with a more complex environment than would exist in a situation where all LCUs were full LCUs and no fractional LCUs have been deployed.

Given the above constraints, there exists a need for a system and method of utilizing a larger percentage of the vertical space in each cabinet while using a homogenous mix of equipment so as to avoid the introduction of unnecessary complexity, and doing so in a configuration that allows all components of the LCU to be used at full capacity.

Accordingly, the present disclosure seeks to solve the above-mentioned problems and others.

SUMMARY OF EXAMPLE EMBODIMENTS

In one embodiment, a switch comprises two or more logical units in a single structure, each of which comprise a rear face plate and multiple networking ports, and wherein the switch is configured to allow a group of servers to be connected to two or more networks.

In one embodiment, a modular switching node comprises a front panel having provision for air flow for the venting of waste heat out the back of the switch node, one or more power connections, a mounting mechanism, and a rear face plate having a plurality of networking ports designed to take up half or less of the width or height of a standard datacenter cabinet slot and used to connect a group of servers into one or more networks.

In one embodiment, a switch housing for housing one or more modular switching nodes comprises one or more power supplies, a mounting mechanism, two or more electrical connections, a front side having provision for air flow (for venting waste heat) and an inner cavity or cavities accessed from the back of the switch.

In one embodiment, a switch housing for housing one or more modular switching nodes comprises two or more power supplies that are wider than the current art, taking all, or substantially all, of the width of the front side of the housing in order to free up additional space at the back of the switch housing.

BRIEF DESCRIPTION OF THE DRAWINGS

FIG. 5 illustrates a top, rear, perspective view of a top-of-rack switch in one embodiment;

FIG. 6A illustrates a top, rear, perspective view of a modular switching node in one embodiment;

FIG. 6B illustrates a top, rear, perspective view of a modular switching node in one embodiment;

FIG. 7 illustrates a front, side, perspective view of a modular switching node in one embodiment;

FIG. 8 illustrates a rear elevation view of a switch housing in one embodiment;

FIG. 9 illustrates a rear, perspective, cutaway view of a switch housing in one embodiment;

FIG. 10A illustrates a rear perspective view of a modular switching node;

FIG. 10B illustrates a rear perspective view of a modular switching node;

FIG. 10C illustrates a rear perspective view of a modular switching node;

FIG. 11A illustrates a front perspective view of a modular switching node;

FIG. 11B illustrates a front perspective view of a modular switching node;

DETAILED DESCRIPTION OF EXAMPLE EMBODIMENTS

Figure 1:
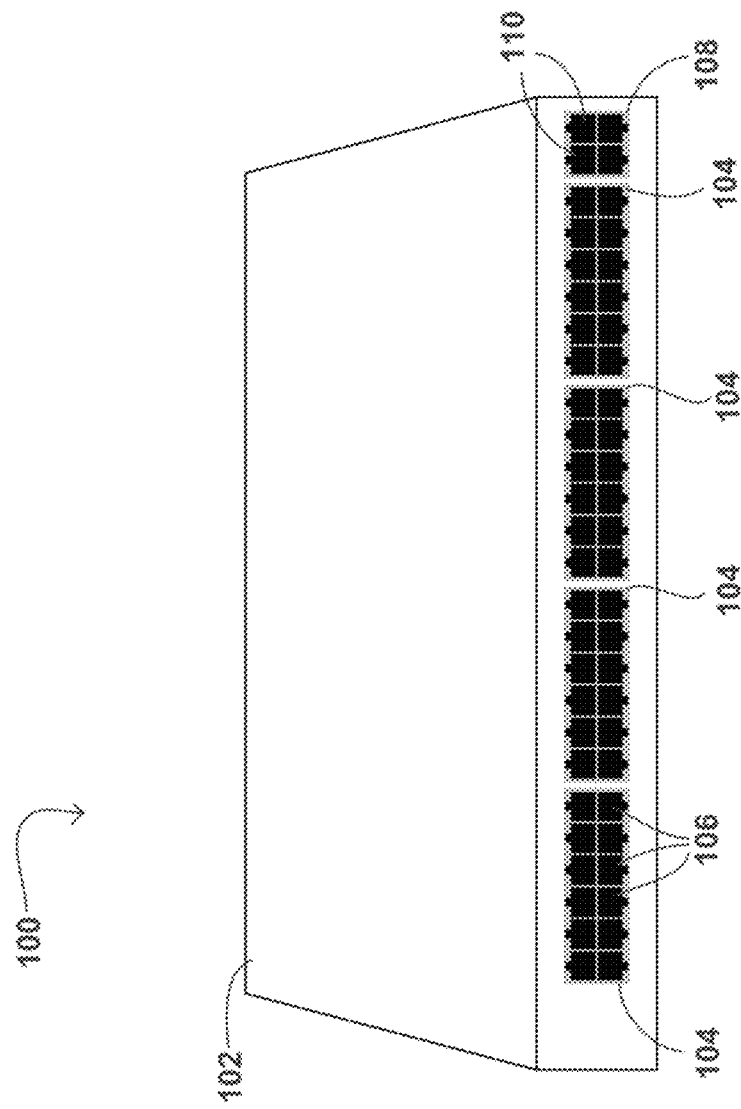
FIG. 1 illustrates a top, rear, perspective view of a top-of-rack switch of the prior art.

The following descriptions depict only example embodiments and are not to be considered limiting in scope. Any reference herein to "the invention" is not intended to restrict or limit the invention to exact features or steps of any one or more of the exemplary embodiments disclosed in the present specification. References to "one embodiment," "an embodiment," "various embodiments," and the like, may indicate that the embodiment(s) so described may include a particular feature, structure, or characteristic, but not every embodiment necessarily includes the particular feature, structure, or characteristic. Further, repeated use of the phrase "in one embodiment," or "in an embodiment," do not necessarily refer to the same embodiment, although they may.

Reference to the drawings is done throughout the disclosure using various numbers. The numbers used are for the convenience of the drafter only and the absence of numbers in an apparent sequence should not be considered limiting and does not imply that additional parts of that particular embodiment exist. Numbering patterns from one embodiment to the other need not imply that each embodiment has similar parts, although it may.

Accordingly, the particular arrangements disclosed are meant to be illustrative only and not limiting as to the scope of the invention, which is to be given the full breadth of the appended claims and any and all equivalents thereof. Although specific terms are employed herein, they are used in a generic and descriptive sense only and not for purposes of limitation. Unless otherwise expressly defined herein, such terms are intended to be given their broad, ordinary, and customary meaning not inconsistent with that applicable in the relevant industry and without restriction to any specific embodiment hereinafter described. As used herein, the article "a" is intended to include one or more items. When used herein to join a list of items, the term "or" denotes at least one of the items, but does not exclude a plurality of items of the list. For exemplary methods or processes, the sequence and/or arrangement of steps described herein are illustrative and not restrictive.

It should be understood that the steps of any such processes or methods are not limited to being carried out in any particular sequence, arrangement, or with any particular graphics or interface. Indeed, the steps of the disclosed processes or methods generally may be carried out in various sequences and arrangements while still falling within the scope of the present invention.

The term "coupled" may mean that two or more elements are in direct physical contact. However, "coupled" may also mean that two or more elements are not in direct contact with each other, but yet still cooperate or interact with each other.

The terms "comprising," "including," "having," and the like, as used with respect to embodiments, are synonymous, and are generally intended as "open" terms (e.g., the term "including" should be interpreted as "including, but not limited to," the term "having" should be interpreted as "having at least," the term "includes" should be interpreted as "includes, but is not limited to," etc.).

As previously discussed, there remains a need for a system and method of utilizing a larger percentage of the vertical space in each cabinet while using a homogenous mix of equipment so as to avoid the introduction of unnecessary complexity, and doing so in a configuration that allows all components of the LCU to be used at full capacity. The modified switch, modular switch housings, and modular switching nodes disclosed herein solve these and other problems.

Figure 2:
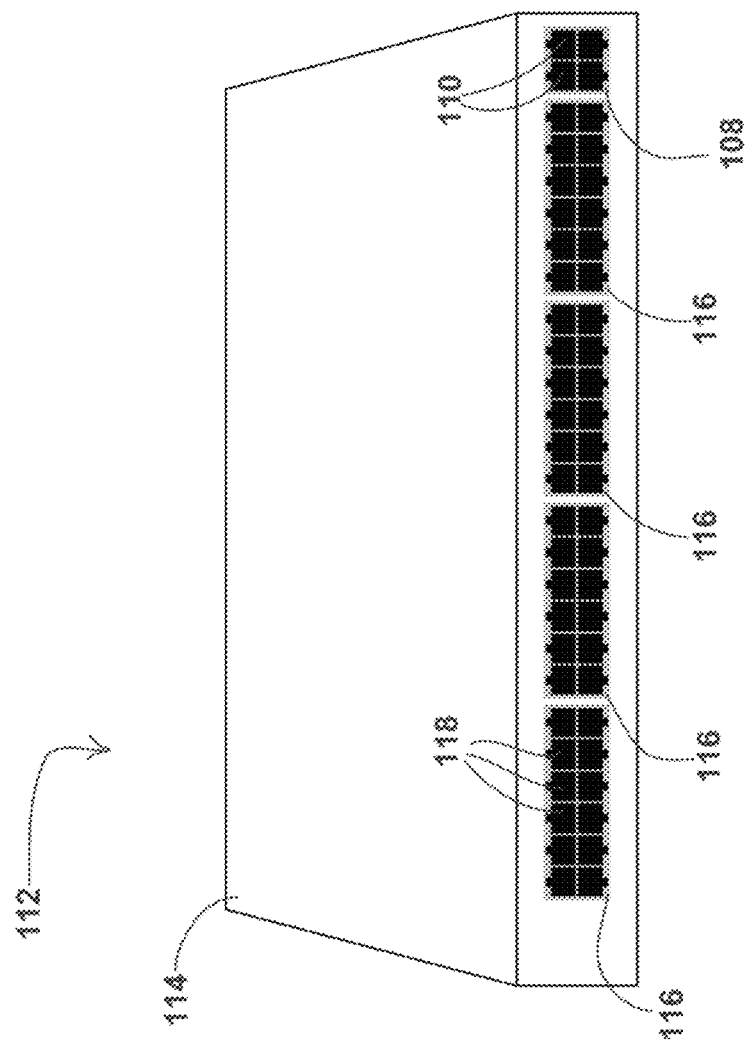
FIG. 2 illustrates a top, rear, perspective view of a top-of-rack switch of the prior art.
Figure 3:
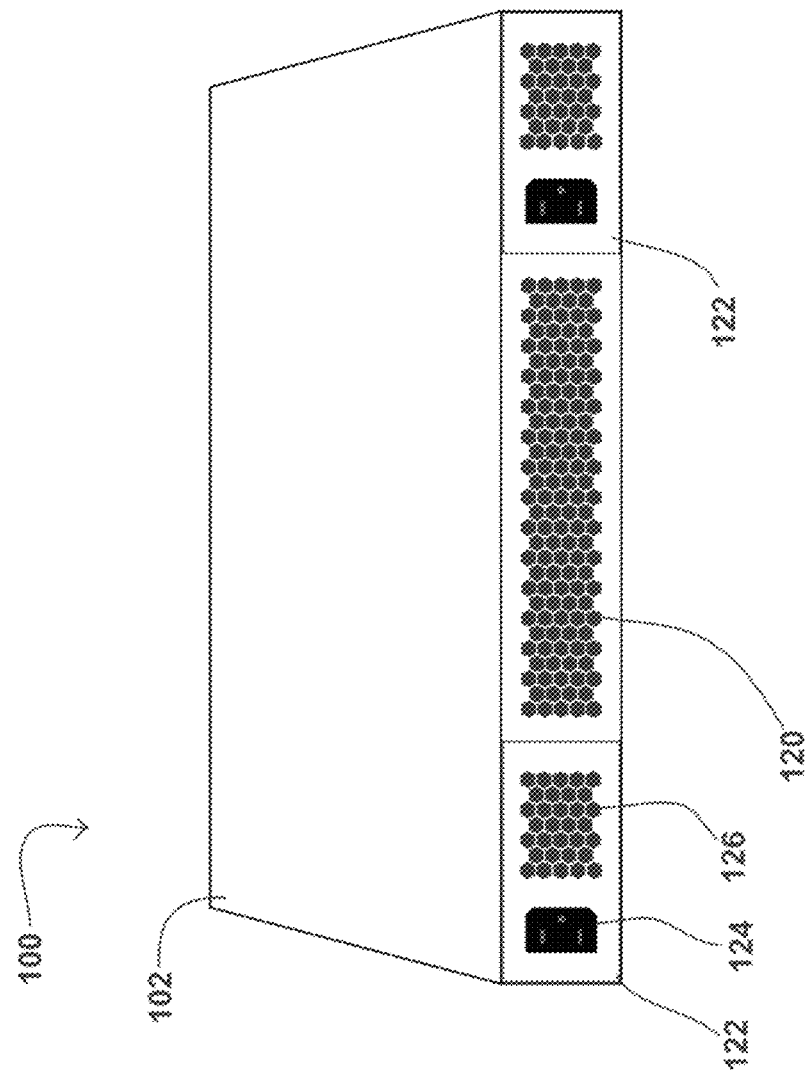
FIG. 3 illustrates a top, front, perspective view of a top-of-rack switch of the prior art.

FIGS. 1-3 illustrate switches of the prior art. Specifically, FIG. 1 illustrates a back, perspective view of a switch 100 of the prior art comprising a housing 102, groupings 104 of twelve downlink Gigabit Ethernet networking ports 106, and grouping 108 of four small formfactor pluggable fiber optic uplink networking ports 110. FIG. 2 illustrates a back, perspective view of a switch 112 of the prior art comprising a housing 114, groupings 116 of twelve downlink 100MBASE-T networking ports 118, and grouping 108 of 4 small form-factor pluggable fiber optic uplink networking ports 110.

FIG. 3 illustrates a front, perspective view of a switch 100 of the prior art comprising a housing 102, vents 120 to facilitate airflow in from the front of the switch for cooling purposes, and modular, hot-swappable power supplies 122 comprising power connectors 124 and vents 126 to facilitate the cooling of the power supply.

Figure 4:
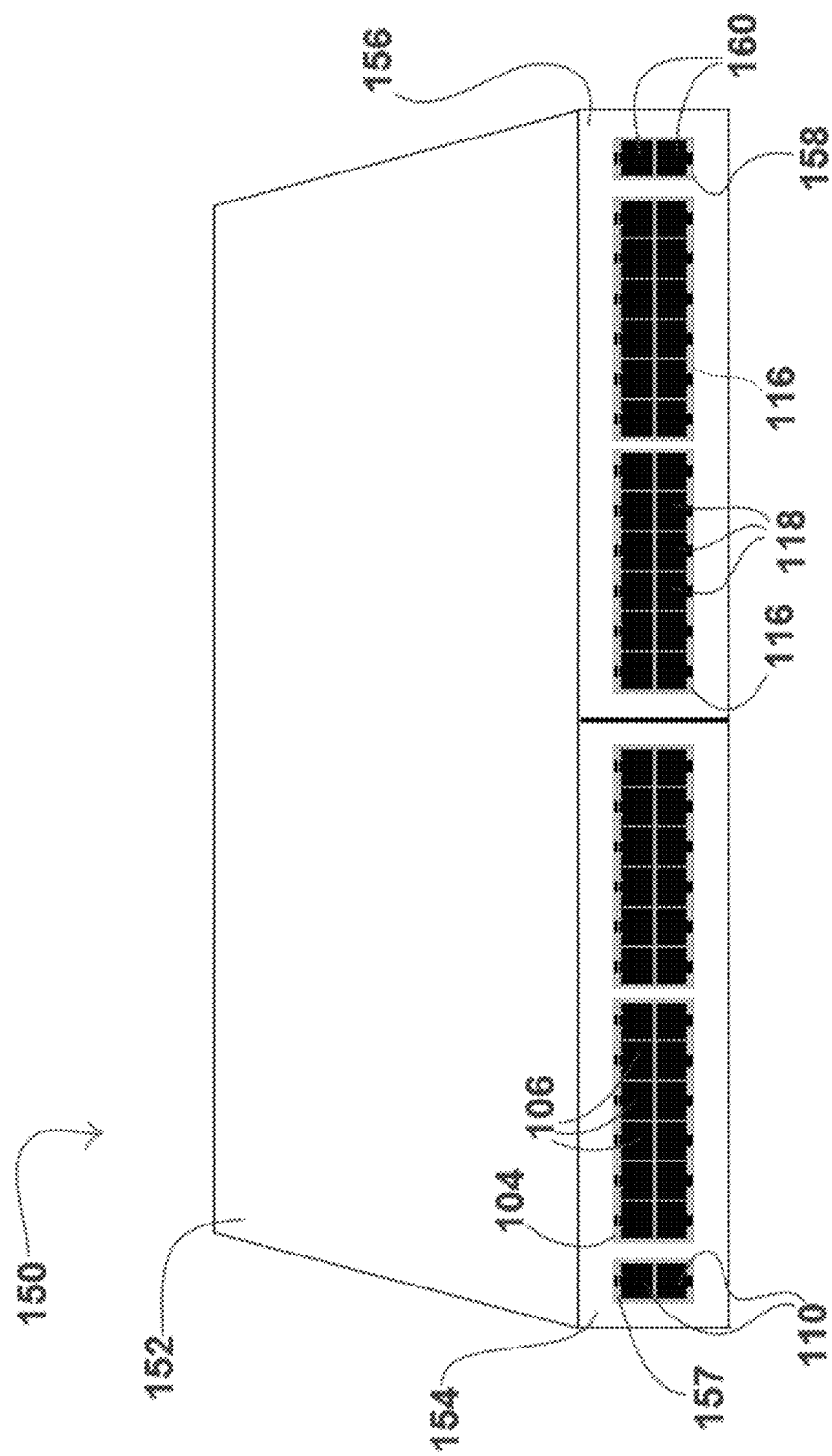
FIG. 4 illustrates a top, rear, perspective view of a top-of-rack switch in one embodiment.

Referring now to embodiments of the present invention, FIG. 4 illustrates, in one embodiment, a switch 150 comprising a housing 152, the housing 152 further comprising two logical switch units 154 and 156 respectively. The logical switch unit 154 comprises groupings 104 of twelve downlink Gigabit Ethernet networking ports 106, and grouping 157 of two small formfactor pluggable fiber optic uplink networking ports 110. The logical switch unit 156 comprises groupings 116 of twelve downlink 100MBASE-T networking ports 118, and grouping 158 of two uplink Gigabit Ethernet networking ports 160. The two logical switching units 154 and 156 are powered by one or more hot-swappable power supplies 122 (not visible in this Fig., but the same as in FIG. 3), and there is no facility for the two logical switching units 154 and 156 to communicate directly with each other. Any communication would involve data being routed through the uplink ports 160 or 110 to the down links on one or more other switches, and then the data traversing across the data backplane of one or more switches in order for the logical switching units 154 and 156 to communicate with each other.

It will be appreciated by those familiar with the art that while Gigabit Ethernet networking ports 106 and 100MBASE-T networking ports 118 are used in the example above as the downlinks, embodiments could exist where the two logical switching units 154 and 156 may use downlinks comprising all 100MBASE-T networking ports 118, all Gigabit Ethernet networking ports 106, all small form-factor pluggable fiber optic uplink networking ports 110, or any combination of these or other non-exemplary ports commonly used in the art. It will be further appreciated by those familiar with the art, that while the small form-factor pluggable fiber optic uplink networking ports 110, and Gigabit Ethernet networking ports 160 are used as uplinks in the example above, embodiments could exist where all small form-factor pluggable fiber optic uplink networking ports 110 are used for uplink ports, all Gigabit Ethernet networking ports 160 are used for uplink ports, or that the uplink ports may be comprised of other non-exemplary ports commonly used in the art. It will likewise be appreciated by those familiar with the art that the number of ports in groups 104, 157, 116, and 158, and the ratio of uplink ports to downlink ports may be changed consistent with the needs of the production environment the switches are designed to service, and the common practices in the art; and that the hot-swappable power supplies 122 allow both logical switching units 154 and 156 to continue in operation if two or more hot-swappable power supplies 122 are used, even if one of the two hot-swappable power supplies 122 were to cease functioning.

This switch configuration provides several benefits, the primary of which is the ability to deploy two different networks into the same vertical space of a cabinet without changing the port density inside the space occupied by the switch, or otherwise losing important functionality or network segregation. In other words, rather than requiring two separate switches and 2U-6U or more space (depending on whether or not a cable management system is used) in order to provide both public and IPMI connectivity (or any other two network types is common usage in the art) to a group of servers, only 1U-3U (depending on whether or not a cable management system is used) is required to provide two different types of networking connectivity to a group of servers. Additionally, splitting the networking ports on the switch 150 between two different networks means that the number of servers, and therefore the vertical height of the servers, associated with the modified switch 150 is halved. This has the effect of allowing the switch 150 and the related servers to be accommodated inside of empty space in a cabinet that is only half the space required for a switch 100 or switch 112 along with the associated servers. This is a dramatic increase to the usable space within a cabinet, allowing for companies to utilize space inside their datacenter that would otherwise go to waste, thereby allowing them to provision more servers without having to increase the size of their datacenter, thereby postponing the capital expenditure involved in building new datacenters.

FIG. 5 illustrates, in one embodiment, a switch 170 comprising a housing 172, the housing 172 further comprising three logical switch units 174, 176, and 178. The logical switch unit 174 comprises groupings 180 of six downlink Gigabit Ethernet networking ports 106, and a grouping 157 of two small form-factor pluggable fiber optic uplink networking ports 110. The logical switch unit 176 comprises groupings 180 of six downlink Gigabit Ethernet networking ports 106 and grouping 157 of two small form-factor pluggable fiber optic uplink networking ports 110. The logical switch unit 178 comprises groupings 182 of six downlink 100MBASE-T networking ports 118, and grouping 158 of two uplink Gigabit Ethernet networking ports 160. The logical switching units 174, 176 and 178 are powered by one or more hot-swappable power supplies 122 (not visible from this view), and there is no facility for the logical switching units 174, 176, and 178 to communicate directly with each other. Any communication would involve data being routed through the uplink ports 160 or 110 to the down links on one or more other switches, and then the data traversing across the data backplane of one or more switches in order for the logical switching units 174, 176, 178 to communicate with each other. It will be appreciated that while Gigabit Ethernet networking ports 106 and 100MBASE-T networking ports 118 are used in the example above as the downlinks, embodiments could exist where the logical switching units 174, 176, and 178 may use downlinks comprising all 100MBASE-T networking ports 118, all Gigabit Ethernet networking ports 106, all small form-factor pluggable fiber optic uplink networking ports 110, or any combination of these or other non-exemplary ports commonly used in the art. It will also be appreciated by those familiar with the art, that while the small form-factor pluggable fiber optic uplink networking ports 110, and Gigabit Ethernet networking ports 160, are used as uplinks in the example above, embodiments could exist where all small form-factor pluggable fiber optic uplink networking ports 110 are used in the uplink spots, all Gigabit Ethernet networking ports 160 are used in the uplink spots, or that the uplink ports may be comprised of other non-exemplary ports commonly used in the art.

It will likewise be appreciated by those familiar with the art that the number of ports in groups 180, 157, 182, and 158, and the ratio of uplink ports to downlink ports may be changed consistent with the needs of the production environment the switches 170 are designed to service, and common practices in the art. This switch 170 configuration provides several benefits, the primary of which is the ability to deploy three different networks into the same vertical space of a cabinet without changing the port density inside the space occupied by the switch 170 or otherwise losing important functionality or network segregation. In other words, rather than requiring three separate switches and 3U-9U (depending on whether or not cable management systems are used in association with one or more or the switches) or more space in order to provide public, private, and IPMI connectivity (or any other three network types in common usage in the art) to a group of servers, only 1U-3U (depending on whether or not a cable management system is used) is required to provide three different types of networking connectivity to a group of servers. Additionally, splitting the networking ports on the switch 170 between three different networks means that the number of servers, and therefore the vertical height of the servers, associated with the modified switch 170 is reduced by two-thirds. This has the effect of allowing the switch 170 and the related servers to be accommodated inside of empty space in a cabinet that is only one-third the space required for a switch 100 or switch 112 along with the associated servers. This is a dramatic increase in the usable space within a cabinet, allowing companies to utilize space inside their datacenter that would otherwise go to waste, thereby allowing them to provision more servers without having to increase the size of their datacenter, thereby postponing the capital expenditure involved in building new datacenters. Those skilled in the art will appreciate that the teachings disclosed herein extend to switches with additional logical switching units. For instance, the creation of a switch having four logical switching units to allow for the connection of a server to two public networks, a private network, and an IPMI network. Accordingly, all such modifications are intended to be included within the scope of this invention.

FIGS. 6A-6B illustrate a rear, perspective view, in one embodiment, of modular switching nodes 200A, 200B, respectively. Each switching node 200A, 200B being a logical switching unit that comprises a housing 202 comprising, groupings 104 of twelve downlink Gigabit Ethernet networking ports 106, and grouping 157 of two small form-factor pluggable fiber optic uplink networking ports 110. The housing 202 further comprises locking mechanisms 204 on each side of the switching node 200A, 200B, respectively, for purposes of securing the modular switching node 200A, 200B in place, such as in a modular switch housing as will be described later herein.

FIG. 7 illustrates a front, perspective view, in one embodiment, of the modular switching node 200A, comprising the housing 202, locking mechanisms 204 (only one side visible), intake air vents 206 used for cooling the data backplane and other electronic components, air vents 208 which pass exhaust air from the modular power supply into the housing 202 for subsequent exhausting out the back of the switch node 200A via vents in the back face plate, top, or bottom of the housing 202 as is normal in the art, and power connectors 210. The power connectors 210 comprise a positive receptacle 212, an optional ground receptacle 214, and a negative receptacle 216 arranged in a horizontal configuration with the optional ground receptacle 214 in the middle of the arrangement.

FIG. 8 and FIG. 9 illustrate a rear elevation view and a rear perspective view respectively, in one embodiment, of a modular switch housing 230 comprising a body 232, intake air vents 234, a dividing panel 236, latching posts 238, and modular power supplies 240 and 241 comprising air exhaust vents 242 and power connectors 244 and 246; power connectors 244 and 246 being designed to couple with power connectors 210 from the modular switch nodes 200A, 200B, respectively. In other words, modular switch nodes 200A, 200B are received within body 232, forming a "network switch assembly." Power connectors 244 being supplied with power from one of the modular power supplies 240 or 241 while power connectors 246 are supplied with power from the other modular power supply 240 or 241 (ensuring power redundancy). Power connectors 244 and 246 each comprise a positive prong 248, an optional ground prong 250, and a negative prong 252 arranged in a horizontal configuration with the optional ground prong 250 in the middle of the arrangement. Adapter 254 is used to ensure correct orientation of the receptacles. In other words, adapter 254 is positioned between the modular power supply 240 or 241, and the modular switching node 200A, 200B in order to position the negative prong 252 on the outside of the power connector 244, and the positive prong 248 on the inside of the power connector. The adapter 254 is necessary because the power supplies 240 and 241 cannot be both modular and consistently direct the negative prong 252 to the outside of the switch housing 230 and the positive prong 248 to the inside of the switch housing 230 without the adapter 254. Wire channel 256 runs from a first power supply 240 to a second power supply 241 and comprises wiring which supplies power to the power connectors 244 and 246 on the far side of the housing. For example, if power supply 240 supplies power to connectors 244, then wire channel 256 is the physical mechanism whereby power is transported from power supply 240 on the left side of the housing to the power connector 244 on the right side of the housing in front of power supply 241.

It will be appreciated that the dividing panel 236 could instead take the form of a post or a panel that doesn't run the entire length of the housing 230. Further, in one embodiment, a dividing panel 236 is not required; instead, one or more latching mechanisms may be located on the sides, top, or bottom. In addition, the vents 206, 208, 234, and 242 could be of a variety of shapes, sizes, positions and arrangements while still fulfilling the same function. Likewise, the latching mechanism 204 and posts 238, which are shown in this embodiment as two on each side of the housing, could be embodied as a single latching mechanism 204 and post 238 for each switching node 200A, 200B, and that the latching mechanisms 204 and post 238 could take a different form or be placed in a different position and still fill the same function. Furthermore, it will be appreciated that the negative prong 252 and the positive prong 248 can be reversed as long as they are always placed in the same position relative to each other, and relative to the negative receptacle 216 and the positive receptacle 212. Likewise, the receptacles 212 and 216 can be reversed with the prongs 248 and 252 such that the prongs are on the modular switch node 200A, 200B and the receptacles are on the housing 230.

This configuration of the switch nodes 200A, 200B and the housing 230 provide the same benefits as the switch 150, namely the ability to provide connectivity to two different networks to a group of servers in a way that doesn't reduce the port density per U of cabinet space or otherwise lose important functionality or network segregation, and in a configuration that allows the LCU to be only one half the height of a traditional LCU consisting of two 48-port switches plus sufficient servers to use all of the ports on both switches. The configuration of the switch nodes 200A, 200B provides additional benefits, the primary of which is a modular nature that allows the replacement or upgrade of a single modular switching node 200A, 200B without requiring the replacement of the entire switch 150 or the entire switch housing 230. Furthermore, while the latching mechanism 204 and the power connectors 210 may take different forms, they are designed to allow a single modular switch node 200A, 200B to be inserted into the housing 230 on either the right or left side. This modularity is desirable because it simplifies the inventory management involved in maintaining replacement parts. Rather than maintaining a reserve of both left side and right side switch nodes 200A, 200B, a smaller reserve of just one model of switch nodes 200A can be maintained and used to replace failing nodes regardless of which side of the switch housing 230 the failing node was plugged into at the time it failed.

FIG. 10 illustrates a rear, perspective view, in one embodiment, of first modular switch node 260A, second modular switch node 260B, and third modular switch node 262, each comprising a housing 264A, 264B, and 266, respectively. Each housing 264A, 264B, and 266 comprises groupings 180 of six downlink Gigabit Ethernet networking ports 106, and a grouping 157 of two small form-factor pluggable fiber optic uplink networking ports 110. As appreciated, the modular switch nodes 260A, 260B, and 262 may have varying formfactors.

FIGS. 11A-11B illustrate a front, perspective view, in one embodiment, of modular switch nodes 260A and 262 (not to scale) comprising housings 264A and 266, respectively. Each housing 264A and 266 comprises one or more latching mechanisms 204. Housing 264A further comprises intake air vents 268 used for cooling the data backplane and other electronic components, air vents 208 which pass exhaust air from the modular power supply (e.g., 122) into the housing 264A for subsequent exhausting out the back of the switch module 264A via vents in the back face plate, top, or bottom of the housing 264A as is normal in the art, and power connectors 210. The power connectors 210 comprising a positive receptacle 212, an optional ground receptacle 214, and a negative receptacle 216 arranged in a horizontal configuration with the optional ground receptacle 214 in the middle of the arrangement. Housing 266 comprises intake air vents 270 used for cooling the data backplane and other electronic components, and power connectors 272 which can take any form common in the art.

Figure 12:
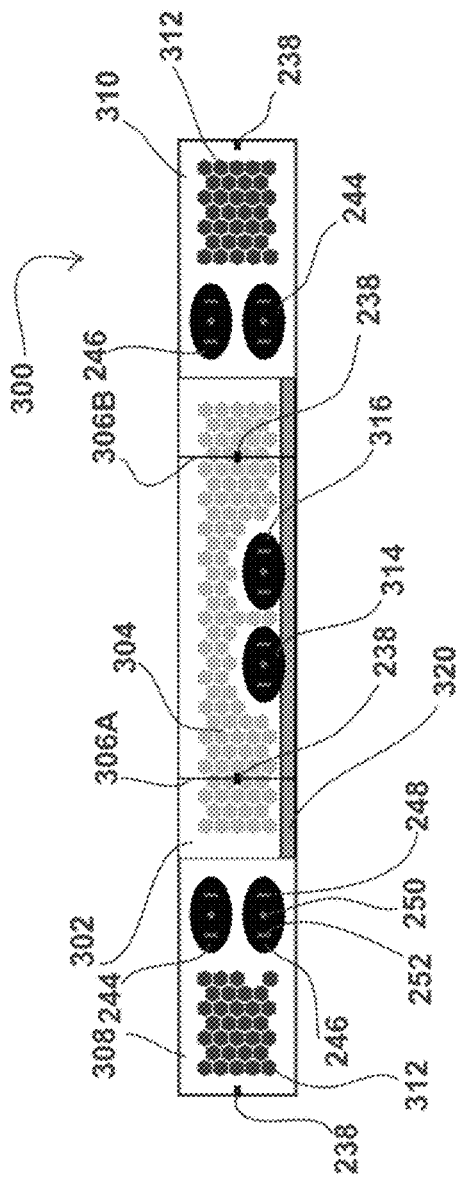
FIG. 12 illustrates a rear elevation view of a switch housing in one embodiment.
Figure 13:
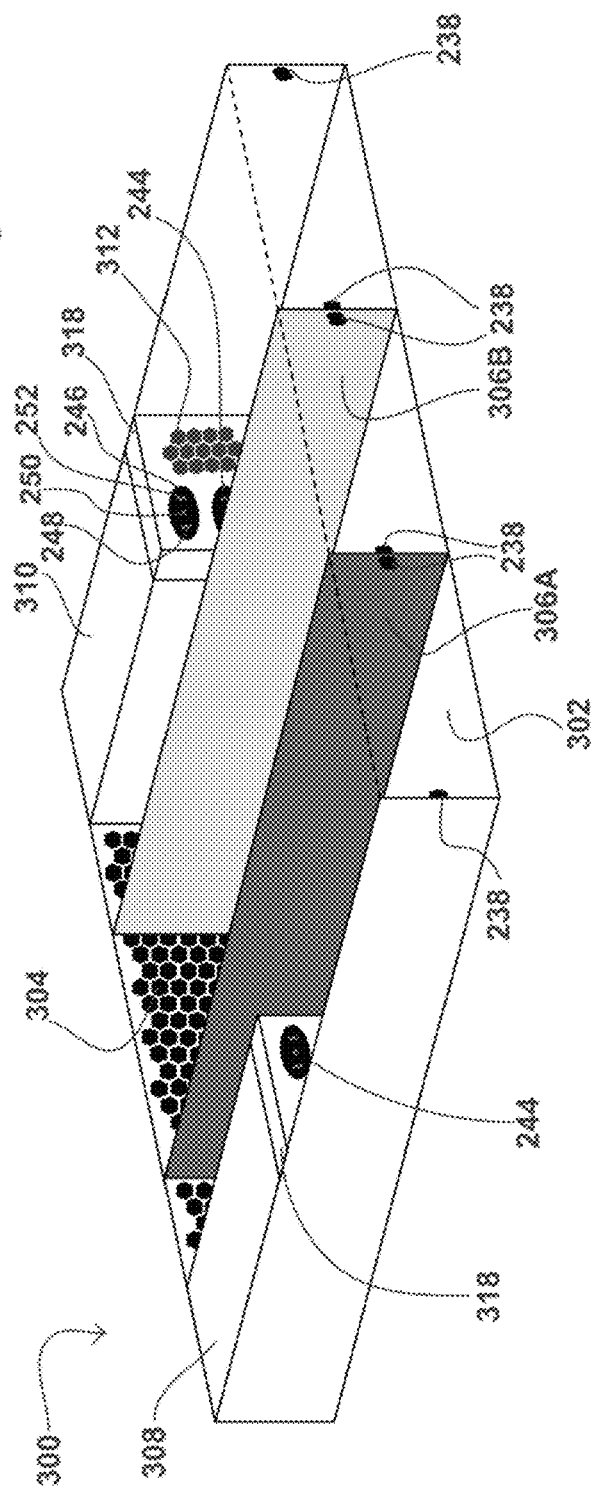
FIG. 13 illustrates a rear, perspective, cutaway view of a switch housing in one embodiment.

FIG. 12 and FIG. 13 illustrate a rear elevation view and a rear perspective view, respectively, in one embodiment, of a modular switch node housing 300 comprising a body 302, intake air vents 304, dividing panels 306A, 306B, latching posts 238, and modular power supplies 308 and 310 comprising air exhaust vents 312 and power connectors 244, 246, 314, and 316. Power connectors 244 and 246 are configured to couple with power connectors 210 from the modular switch node 260A, 260B while power connectors 314 and 316 are configured to couple with power connectors 272 from the modular switch node 262. Power connectors 244 and 314 being supplied with power from one of the modular power supplies 308 or 310 while power connectors 246 and 316 are supplied with power from the other modular power supply 308 or 310. Power connectors 244 and 246 comprise a positive prong 248, an optional ground prong 250, and a negative prong 252 arranged in a horizontal configuration with the optional ground prong 250 in the middle of the arrangement. Adapter 318 is positioned between the modular power supplies 308 and 310, and the modular switching node 260A, 260B in order to position the negative prong 252 on the outside of the power connector 244, and the positive prong 248 on the inside of the power connector. The adapter 318 is necessary because the power supplies 308 and 310 cannot be both modular and consistently direct the negative prong 252 to the outside of the switch housing 300 and the positive prong 248 to the inside of the switch housing 300 without the adapter 318. Wire channel 320 runs from the first power supply 308 to the second power supply 310 and comprises wiring which supplies power to the power connectors 314, 316, 244 and 246 on the far side of the housing.

For example, if power supply 308 supplies power to connectors 244, then wire channel 320 is the physical mechanism whereby power is transported from first power supply 308 on the left of the housing to the power connector 314 in the middle of housing 300 and to the power connector 244 on the right side of the housing in front of second power supply 310. Those familiar with the art will appreciate that the power supplies 308 and 310 could power different power connectors 244, 246, 314, and 316 as long as each switching node 260A, 260B is powered by two connectors 244, 246, 314, and 316 one of which is powered by one power supply 308 or 310, and the other of which is powered by the other power supply 308 or 310 (i.e., power redundancy).

Those familiar with the art will likewise appreciate that the dividing panels 306A, 306B could instead take the form of a post or a panel that doesn't run the entire length of the body 302, and that the vents 208, 268, 270, 304, and 312 could be of a variety of shapes, sizes, positions and arrangements while still fulfilling the same function. Likewise, those familiar with the art will appreciate that the latching mechanism 204 and posts 238, which are shown in this embodiment as having two on each side of the housing, could be embodied as a single latching mechanism 204 and post 238 for each switching node 260A, 260B, or 262, as being placed in a different position on the housing 300 or switch nodes 260A, 260B, and 262, or that they might take a different form while still fulfilling the same function. Furthermore, it will be appreciated that the negative prong 252 and the positive prong 248 can be reversed as long as they are always placed in the same position relative to each other, and relative to the negative receptacle 216 and the positive receptacle 212. Likewise, the receptacles 212 and 216 (FIG. 11) can be switched with the prongs 248 and 252 (FIG. 12) such that the prongs are on the modular switch node 260A, 260B, or 262 and the receptacles are on the housing 230.

This configuration of the switch nodes 260A, 260B, and 262 and the housing 300 provide the same benefits as the switch 170, namely, the ability to provide connectivity to up to three different networks to a group of servers in a way that doesn't reduce the port density per U of cabinet space, or otherwise losing important functionality or network segregation, and in a configuration that allows the LCU to be only one third the height of a traditional LCU consisting of three 48-port switches plus cable management systems and sufficient servers to use all of the ports on both switches. The configuration of the switch nodes 260A, 260B, and 262 (FIG. 10A-10C) provides additional benefits, the primary of which is a modular nature that allows the replacement or upgrade of a single modular switching node 260A, 260B, or 262 without requiring the replacement of the entire switch 170 or switch housing 300. Furthermore, while the latching mechanism 204 and the power connectors 210 may take different forms, they are designed to allow a single modular switch node 260A, 260B, or 262 to be inserted into the housing 300. This modularity is desirable because it simplifies the inventory management involved in maintaining replacement parts. Rather than maintaining a reserve of both left side and right side switch nodes 260A, 260B, a smaller reserve of just one model of switch nodes 260A can be maintained and used to replace failing nodes regardless of which side of the switch housing 300 the failing node was plugged into at the time it failed. Switch node 262 may be complementary in shape to switch nodes 260A, 260B such that it may be interposed between switch nodes 260A, 260B.

Figure 14:
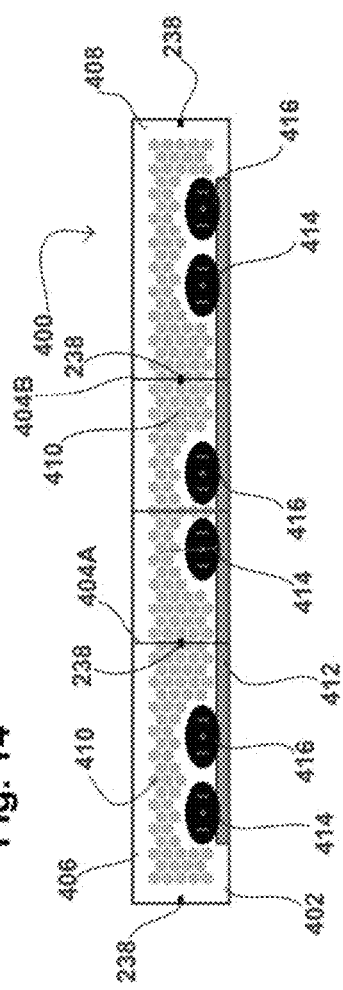
FIG. 14 illustrates a rear elevation view of a switch housing in one embodiment.
Figure 15:
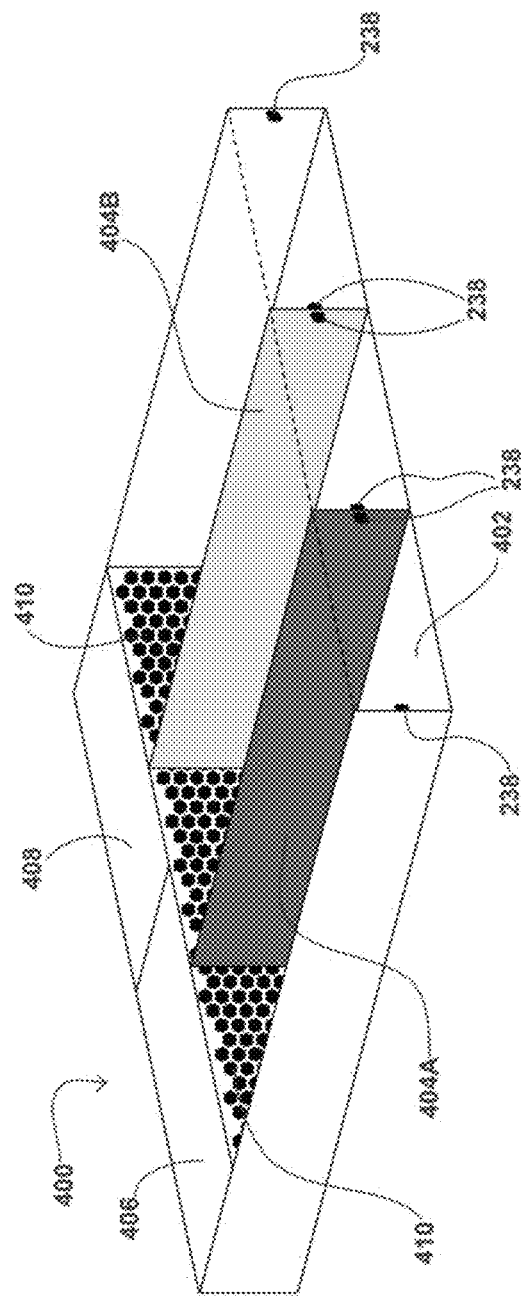
FIG. 15 illustrates a back, perspective view of a switch housing in one embodiment.

FIG. 14 and FIG. 15 illustrate a rear elevation view and a rear perspective view, respectively, in one embodiment, of a modular switch housing 400 comprising a body 402 which may require more or less of the depth of the datacenter cabinet than is common in the current top-of-rack switches in the art, dividing panels 404A, 404B, latching posts 238, and modular power supplies 406 and 408 comprising air exhaust vents 410 on both the front and back sides of the power supplies 406 and 408. The switch housing 400 further comprises a wire channel 412 which connects to power connectors 414 and 416 of a type common in the art, and routes power from the modular power supplies 406 and 408 to the power connectors 414 and 416. The power connectors 414 and 416 are designed to couple with the power connectors 272 on the modular switch node 262, or similar switch node. The wire channel 412 is designed so that the power connectors 414 and 416 are fed from the modular power supplies 406 and 408 in a configuration so that each switch node 262, or similar switch node, receives the full amount of power required to remain in operation even if one of the power supplies 406 or 408 ceases to function. For example, the first power supply 406 would provide power to the power connectors 414 and the second power supply 408 would provide power to the power connectors 416. Those familiar with the art will appreciate that while the art demonstrates a wire channel 412 and two power connectors 414 and 416 per modular switch node 262, embodiments exist where the power connectors 414 and 416 could be consolidated into a single connector (with a corresponding single connector on the modular switch node 262) with power management taking place inside of a component which replaces the wire channel 412, said component ensuring that the supply of power into the single plug, and therefore the supply of power to the switch node 262, or similar switch node, is not interrupted in the event that a single power supply 406 or 408 ceases to function. It will be appreciated that similar changes could be made to power connectors 244, 246, 314, 316 (FIG. 8 & FIG. 12) and wire channels 256, 320 (FIG. 8 & FIG. 12) to allow the power connectors 244, 246, 314, 316 to be consolidated into a single connector per switch node, and the replacement of the wire channel with a component that ensures that the power supplied to the single plug per node is not interrupted in the event that a modular power supply 240, 241, 308 or 310 (FIG. 8 & FIG. 12) fails. It will likewise be appreciated that the dividing panels 404A, 404B could instead take the form of a post or a panel that doesn't run the entire length of the body 402, and that the vents 410 (and the corresponding vents on the modular switch unit 262, or other switch node) could be of a variety of shapes, sizes, positions and arrangements while still fulfilling the same function. Further, the latching mechanism 204 and posts 238, which are shown in this embodiment as two on each compartment of the housing 400, could be embodied as a single latching mechanism 204 and post 238 for each switching node 262, and that they could be positioned differently on the body 402 and switch node 262.

This configuration of the switch nodes 262 and the node housing 400 (collectively, a network switch assembly) provide the same benefits as the switches 260A, 260B, 262 and node housing 300, namely, the ability to provide connectivity to up to three different networks to a group of servers in a way that doesn't reduce the port density per U of cabinet space, or otherwise losing important functionality or network segregation, and in a configuration that allows the LCU to be only one third the height of a traditional LCU having three 48-port switches plus sufficient servers to use all of the ports on both switches. The configuration of the switch nodes 262 with the housing 400 provides additional benefits, the primary of which is a more truly modular nature that allows a single modular switching node 262 to be inserted into any open spots in the housing 400. This modularity is desirable because it simplifies the inventory management involved in maintaining replacement parts, and allows a modular switching node 262 to be upgraded to a switching node with more capable networking ports or data backplane without requiring the replacement of the entire switch as would be required in the existing art. Rather than maintaining a reserve of left side and right side switch nodes 260A, 260B, and a reserve of middle switch nodes 262, a single, smaller reserve of just switch nodes 262 can be maintained and used to replace failing nodes.

Those skilled in the art will appreciate that the teachings disclosed herein extend to modular switching units and switch housings having more than two or three modules. For instance, the creation of a switch having four modular switching units to allow for the connection of a server to two public networks, a private network, and an IPMI network, and that the use of modular power supplies 406 and 408 which take all, or substantially all, of the width of the switch or switch housing may be extended to housings designed to work with as few as two switching nodes, or to housings designed to work with four or more switching nodes. Accordingly, all such modifications are intended to be included within the scope of this invention.

Therefore, it is appreciated that the switching nodes described herein solve the need for a system and method of utilizing a larger percentage of the vertical space in each cabinet while using a homogenous mix of equipment so as to avoid the introduction of unnecessary complexity, and doing so in a configuration that allows all components of the LCU to be used at full capacity.

Exemplary embodiments are described above. No element, act, or instruction used in this description should be construed as important, necessary, critical, or essential unless explicitly described as such. Although only a few of the exemplary embodiments have been described in detail herein, those skilled in the art will readily appreciate that many modifications are possible in these exemplary embodiments without materially departing from the novel teachings and advantages herein. Accordingly, all such modifications are intended to be included within the scope of this invention.

What is claimed is:

1. A network switch assembly, comprising:
   at least two modular switch nodes, each modular switch node comprising:
     a housing having at least one latching mechanism thereon;
     at least one air vent;
     at least one power connector comprising a positive receptacle, a ground receptacle, and a negative receptacle all arranged horizontally in relation to one another; and
     a plurality of networking ports;
   a node housing, comprising:
     a body having at least one air vent;
     at least one latching post for mating with the at least one latching mechanism of the modular switch node; and
     at least two power supplies, the power supplies being electrically coupled via a wire channel, each power supply comprising an adapter couplable thereto to ensure correct orientation of the positive receptacle, the ground receptacle, and the negative receptacle;
   wherein the at least two modular switch nodes are received within the node housing.

2. The network switch assembly of claim 1, further comprising a dividing panel.

3. The network switch assembly of claim 2, wherein the dividing panel is interposed between the at least two modular switch nodes.

4. The network switch assembly of claim 1, wherein the at least two modular switch nodes are independently removable from the node housing.

5. The network switch assembly of claim 1, wherein each modular switch node is independently connected to a network.

6. A network switch assembly, comprising:
   a plurality of modular switch nodes, each having a latching mechanism, at least one air vent, at least one power connector, and a plurality of networking ports;
   wherein each modular switch node is receivable within a modular switch housing, each modular switch node positioned horizontally adjacent to each other within the modular switch housing;
   the modular switch housing comprising:
     a body having at least one air vent;
     a vertical dividing panel between each modular switch node;
     a plurality of latching posts, each latching post mating with the latching mechanism of each respective modular switch node; and
     a plurality of power supplies; and
   a plurality of adapters, each adapter interposed between a respective power supply of the modular switch housing and the power connector of each modular switch node to ensure correct orientation of the power connectors when coupled to the power supplies, each of the power connector comprising a positive receptacle, a ground receptacle, and a negative receptacle all arranged horizontally in relation to one another.

* * * * *